July 14, 1964 P. R. AMLINGER ETAL 3,141,135

SEMICONDUCTIVE OSCILLATOR-MIXER DEVICE

Filed May 11, 1962

INVENTORS
Philipp R. Amlinger &
John P. Stelmak
BY
Gordon H. Telfer
ATTORNEY

United States Patent Office 3,141,135
Patented July 14, 1964

3,141,135
SEMICONDUCTIVE OSCILLATOR-MIXER DEVICE

Philipp R. Amlinger, Latrobe, and John P. Stelmak, Greensburg, Pa., assignors to Westinghouse Electric Corporation, East Pittsburgh, Pa., a corporation of Pennsylvania Filed May 11, 1962, Ser. No. 194,132
3 Claims. (Cl. 325—451)

This invention relates generally to electronic apparatus capable of converting the frequency of an input carrier wave to produce a modulated intermediate frequency signal, and, more particularly, to semiconductive devices which are capable of achieving oscillator and mixer functions within a unitary body of semiconductive material.

Conventional superheterodyne radio receivers require that the input carrier wave be converted to a modulated wave at lower frequency, generally in the intermediate frequency range. For this purpose there may be provided a circuit including an oscillator which produces a local oscillator signal and a mixer which mixes the local oscillator signal and the input carrier wave so that the output is an intermediate frequency signal containing the information of the input carrier wave.

In order to provide electronic apparatus with increased reliability and smaller size with possibly reduced cost, increasing attention has been given to the molecular electronics concept by which integrated circuits or functional electronic blocks are developed to provide an entire circuit function from within a single body of semiconductive material.

The design of functional electronic blocks is made difficult by the fact that individual electronic functions cannot always be incorporated directly within a semiconductive body. For example, inductances are as yet difficult to produce satisfactorily within semiconductive devices. Hence, circuit design must be approached from the standpoint of available techniques for incorporating electronic functions and the device must be designed so as to provide the desired circuit functions without the introduction of unwanted interaction between portions of the devices.

It is, therefore, an object of the present invention to provide improved electronic apparatus for use as an oscillator-mixer.

Another object is to provide a monolithic semiconductive device capable of performing the entire function of an oscillator-mixer circuit.

The invention, in brief, provides a semiconductive oscillator-mixer comprising first and second transistor means; the first transistor means operates as an oscillator and the second transistor means operates as a mixer. The oscillator and mixer portions have direct A.C. as well as D.C. coupling by the emitter of the first transistor means being coupled through a resistance to the base of the second transistor means. This combination of elements may be provided by conventionally interconnected individual components but it is particularly suitable for fabrication as a functional electronic block within a unitary body of semiconductive material.

In the preferred form of the invention, a unitary device is provided which includes a substrate and other doped regions to provide first and second transistor functional equivalents and interconnecting means also included within the unitary body of semiconductive material to provide a feedback loop for the first transistor functional equivalent so that it may operate as an oscillator and to provide bias means for the first and second transistor functional equivalents and interconnecting means from the emitter of the first transistor functional equivalent to the base of the second transistor functional equivalent and between the base and emitter of the second transistor functional equivalent.

The present invention, both as to its organization and manner of operation, together with the above-mentioned and further objects and advantages thereof, may best be understood by reference to the following description, taken in connection with the accompanying drawings, in which.

Figure 1:
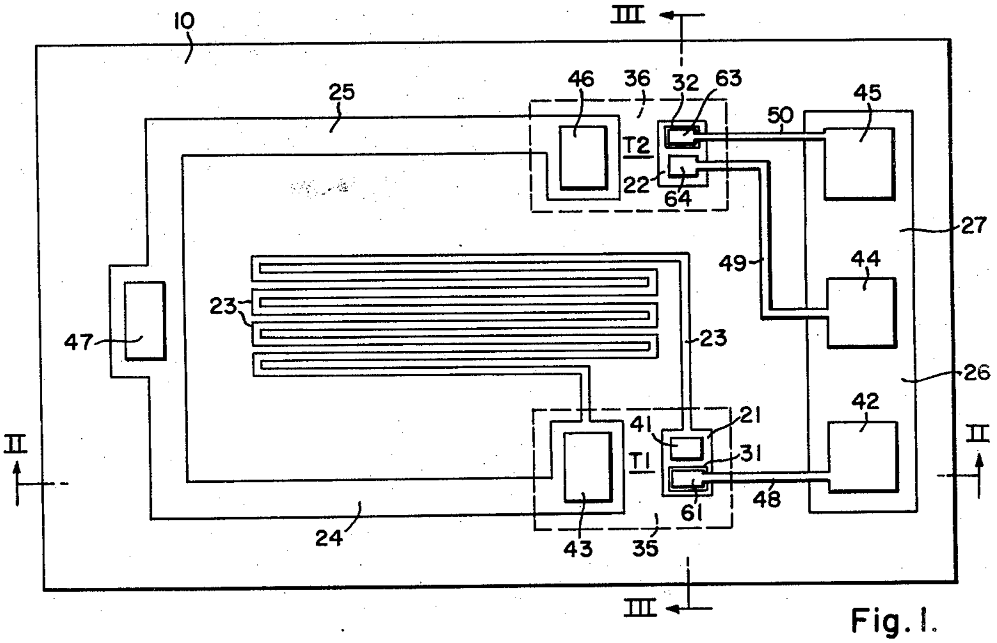
FIGURE 1 is a plan view of a semiconductive device in accordance with this invention.
Figure 2:
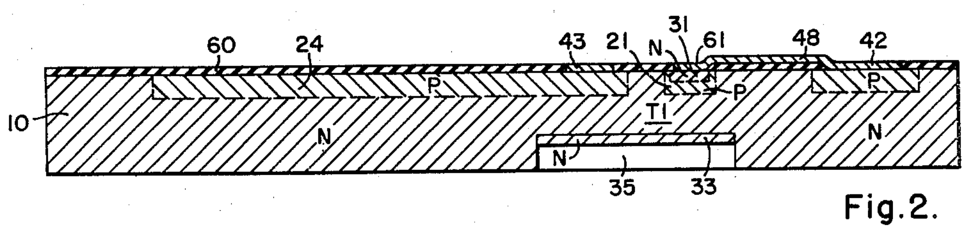
FIGURE 2 is a cross-sectional view taken along the line II—II of FIG. 1.
Figure 3:
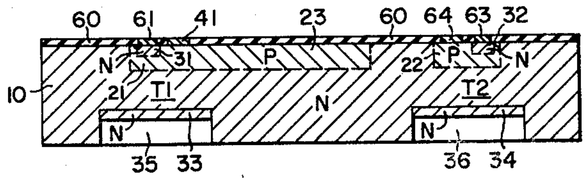
FIGURE 3 is a cross-sectional view taken along the line III—III of FIG. 1.

Referring now to the drawing, FIGURES 1 to 3 show an example of the device structure in accordance with this invention including a substrate 10 of one semiconductivity type, here shown as N-type. The substrate 10 is preferably of high resistivity material. Within the upper major surface of the substrate 10 there are formed, for example by diffusion, a plurality of P-type regions and a plurality of N-type regions which are of lower resistivity than the substrate and which may, for example, also be formed by diffusion. A plurality of conductive contacts and interconnections are also disposed on the device surface where desired to apply a lead or to make conductive interconnection between two regions of the device.

Figure 4:
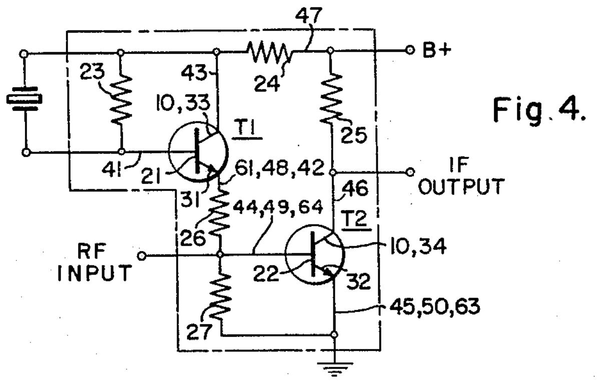
FIGURE 4 is the approximate equivalent circuit of the device of FIGS. 1 through 3 with additional circuit components.

Referring to FIGURE 4 together with FIGS. 1 to 3, the functions of the various regions of the device will be discussed. A first transistor functional equivalent T1 is provided by the P-type region 21 and the N-type region 31 which provide base and emitter functions, respectively, and the portion of the substrate 10 disposed below and in the vicinity of the P-type region 21 and the low resistivity N-type region 33 which provide a collector function. The N-type collector 33 is disposed within a cavity 35 in the lower surface of the substrate 10.

A second transistor functional equivalent T2 is provided by the P-type region 22, the N-type region 32, which provide base and emitter functions, respectively, and that portion of the substrate 10 immediately below and in the vicinity of the P-type region 22 and the low resistivity N-type region 34 which provide a collector function. The N-type collector 34 is disposed within a cavity 36 in the lower surface of the substrate 10.

For the regions providing the transistor functional equivalents T1 and T2, design considerations affecting gain, reverse breakdown voltage and other parameters are substantially the same as in designing an individual transistor component.

Integral with the P-type portion 21, is the P-type region 23 which extends in a continuous irregular path from the region 21 to the extremity of the P-type region 24 where the collector contact 43 is disposed. The P-type region 23 thus provides a resistance across the base and collector of the transistor functional equivalent T1.

The P-type region 24 extends from the collector contact 43 of the first transistor functional equivalent T1 to a contact 47 disposed for the application of a D.C. supply voltage. Thus the P-type region 24 provides a bias resistance to the collector contact 43 of the transistor functional equivalent T1.

In a similar manner, a fifth P-type region 25 extends from the collector contact 46 of the transistor functional equivalent T2 to the supply contact 47 and thus provides a bias resistance connected to the collector contact 46 of the transistor functional equivalent T2. It will be noted that for convenience the P-type portions 21, 23, 24, and 25 are formed as part of a continuous region.

The collector contacts 43 and 46 of transistor functional equivalents T1 and T2, respectively, are disposed in P-type semiconductive material while the substrate and the collector regions 33 and 34 are N-type. However, it will be noted from the equivalent circuit of FIG. 4, the junction between the N-type collector material and the P-type material on which the collector contact is disposed is always in a forward bias due to the manner in which the D.C. supply voltage is applied. Therefore, there is a path of sufficient conductivity to the collector contacts. Other means may be employed to enhance the conductive path such as that disclosed in copending application Serial No. 38,051, filed June 22, 1960 by J. P. Stelmak and assigned to the same assignee as the present invention.

A sixth P-type region 26 extends between two contacts 42 and 44 which are conductively joined by interconnections 48 and 49, respectively, to the emitter contact 61 of the first transistor functional equivalent T1 and the base contact 64 of the second transistor functional equivalent T2. A seventh P-type region 27, which is part of a continuous region including the portion 26, is disposed between contacts 44 and 45. Contact 45 is conductively connected by interconnection 50 to the emitter contact 63 of the second transistor functional equivalent T2 to thus complete the circuit shown in FIG. 4.

The disposition of the conductive contacts and interconnections will now be described more fully. A conductive contact 41 is disposed on the P-type region 21 to serve as a base contact to the first transistor functional equivalent T1 to which a lead (not shown) is applied for connection to a piezoelectric crystal in the external circuit. The second conductive contact 42 is disposed on one extremity of the P-type portion 26. A third conductive contact 43 is disposed between the P-type regions 23 and 24 and serves as a collector contact for T1. The conductive contact 43 has a lead (not shown) fixed thereto for application to the other side of the piezoelectric crystal in the external circuit. A fourth conductive contact 44 is disposed on the base 22 of T2 and has a lead (not shown) applied thereto for application of an RF input signal to the device. Conductive contact 44 also extends to the P-type portions 26 and 27. A fifth conductive contact 45 is disposed on an extremity of P-type portion 27. A sixth conductive contact 46 is disposed on the extremity of P-type portion 25 and serves as a collector contact for T2. A lead (not shown) is affixed to the contact 46 and serves as an IF output lead. A lead (not shown) is connected to the contact 45 and serves as a ground terminal. A seventh conductive contact 47 is disposed at the mid-point between P-type portions 24, 25 and has a lead (not shown) affixed thereto for the application of a positive D.C. potential.

In FIG. 1 there is not shown the oxide surface layer which would cover the entire surface except where conductive contact is made. FIGURES 2 and 3 do show the oxide layer 60. As shown in FIG. 2, openings in the oxide layer 60 permit the disposition of the contacts 42, 43 and 61. In FIG. 3, similarly, contacts 41, 61, 63 and 64 are disposed through openings in the oxide layer 60.

The conductive interconnection 48, as shown in FIG. 2, is joined with the contacts 42 and 61 and extends over the oxide layer 60 between the contacts. The oxide layer 60 serves several functions including protection of the junctions which would otherwise be exposed at the surface of the device and would deteriorate in their characteristics if contaminated. Also, the oxide layer 60 permits the passing of a conductive coating over a junction to another region without shorting the junction as in the case of the interconnection 48. In each case in which a connection is shown in FIG. 1 passing over a junction it is to be understood that the junction is protected by some form of electrical insulation such as the oxide layer 60.

In the circuit of FIG. 4, T1 is a single stage degenerative emitter transistor providing an oscillator function in association with the series resonance piezoelectric crystal of quartz, for example, connected between the collector and base of T1. The crystal is preferably of the type producing oscillation in the fundamental mode. The oscillator output is taken from the emitter 31 of T1, thus minimizing interference of the oscillator loop with other portions of the circuit. The resistance 23 between the base 21 and collector of T1 provides the base bias and further enhances the stability of the circuit.

The mixer portion of the device is provided by T2 which is the equivalent of a transistor in a single stage common emitter configuration. The oscillator output is directly coupled to the base 22 of T2 for optimum mixing efficiency and also achieves the purpose of eliminating a coupling capacitor and providing a base bias on T2 without separate bias resistors. The injection of signal to the mixer from the center tap between the resistances 26 and 27 further minimizes possible interference which might result due to extreme differences in the input RF and oscillation signal levels. However, it should be noted that the signal injection can also be from the emitter 31 of T1 instead of the center tap. This circuit provides a low input impedance, thus rendering it practically insensitive to variations in the RF source impedance.

The equivalent circuit of FIG. 4 requires a relatively small number of components which facilitates adaptation to a functional electronic block. Furthermore, this circuit achieves operation with optimum signal injection and low interference over a wide frequency range. The circuit operates with a relatively low power requirement, has a low input impedance and is highly stable.

An example of a method suitable for the fabrication of the device of FIGS. 1 to 3 will now be described. A starting wafer may be prepared by any of the known methods, for example, a single crystal silicon rod may be pulled from a melt composed of silicon and at least one element from group V of the Periodic Table such as arsenic, antimony or phosphorus. For a relatively high resistivity of about 100 ohm-centimeters, which is desired, the impurity level is adjusted to approximately $10^{14}$ atoms per cubic centimeter. The wafer is then cut from the rod in a suitable manner such as by use of a diamond saw. The cut surface of the wafer may then be lapped or etched or both in order to produce a smooth surface after sawing. Alternatively, the semiconductor device of this invention may be prepared from a section of a dendritic crystal prepared in accordance with Patent 3,031,403, by A. I. Bennett, Jr., issued April 24, 1962, and assigned to the same assignee as the present invention. It will be understood that the material of the original wafer is that which makes up the substrate 10 of the device shown in the drawing with the other regions being produced by subsequent processing operations upon the original wafer.

The size of the starting wafer is, of course, determined by the functions it must provide after fabrication. The transistor functional equivalents T1 and T2 will require a certain bulk volume of material depending upon their desired characteristics and the resistive regions 23 through 27 will necessarily be proportioned so as to provide resistances of the approximate magnitude for circuit operation. For the device shown herein a starting wafer of about 100 mils by 200 mils in major surface dimensions and with a thickness of about 4 mils is suitable.

There is formed on the surface of the starting wafer an oxide layer having a thickness of about 5000 angstroms. This may be formed by heating the semiconductor body in an argon atmosphere containing water vapor at a temperature of about 1000° C. Then the upper surface of the wafer is coated with a photoresist material which is then exposed through an optical mask so that the photoresist material is removable in those areas which coincide with the portions of the upper surface on which the P-type material 21, 22, 23, 24, 25, 26 and 27 is to be formed.

After removal of the photoresist coating in the appropriate pattern, a suitable etchant is used to remove the exposed oxide layer so as to provide openings exposing the semiconductive material. A suitable P-type impurity such as boron is then diffused into the wafer at the exposed portions by disposing the wafer in a furnace which has its hottest zone at a temperature of about 1100° C. to 1250° C. and whose atmosphere includes boron. Boron is preferred for this purpose rather than other acceptor impurities since it has been found not to diffuse through the oxide surface layer as much as in the case of other acceptor impurities. The zone of the furnace in which a crucible containing the boron is disposed is maintained at a lower temperature being chosen to insure the desired vapor pressure or boron in the atmosphere. Diffusion is continued for a time calculated to be sufficient to provide a surface concentration of about $10^{17}$ to $10^{18}$ atoms per cubic centimeter in a layer of about 0.2 mil thickness.

The entire semiconductor body is then again oxidized and by the use of photoresist material and an optical mask, openings are again formed in the oxide layer. In this operation, the openings are in the desired location for the N-type emitter regions 31 and 32 and the collector regions 33 and 34. In a similar manner as that in which the boron diffusion is carried out, diffusion of a suitable donor type impurity such as phosphorus is then performed into those exposed regions until the surface concentration of about $10^{21}$ atoms per cubic centimeter to a depth of about 0.1 mil is achieved.

In the foregoing diffusion operations, it is preferable that during each diffusion water vapor be available in the diffusant so that an oxide layer is simultaneously produced with the diffusion of the impurity into the wafer.

After the second diffusion, the oxide layer is again removed in selective portions by etching after exposure through suitable optical mask of a photoresist coating in those areas where conductive contacts 41, 42, 43, 44, 45, 46, 47, 61, 63 and 64 are to be made. It will be recalled, however, from the previous discussion that the oxide layer remains on those portions of the device where conductive interconnections 48, 49 and 50 are to be insulated from the semiconductive surface. After removal of the oxide layer in selected areas, evaporated metal is deposited in these regions, a suitable metal being aluminum and by a subsequent heating operation the deposited metal is alloyed to the semiconductive material. The interconnections 48, 49 and 50 may be made simultaneously with the contacts or the contacts may be made first to permit separate testing of T1 and T2.

The leads to the contacts 41, 43, 44, 45, 46 and 47 are then affixed by brazing, for example. The device is then mounted on a header and hermetically sealed.

With a device such as that just described, oscillation in excess of 30 megacycles has been obtained with good conversion gain and a total D.C. power dissipation below 100 milliwatts. For an input RF signal of 28.3 megacycles and an oscillator frequency of either 25.3 megacycles or 31.3 megacycles (that is, to provide a three megacycle intermediate frequency output signal), there were observed: 20 db voltage conversion gain into a 4.7 kilohm load with the D.C. supply voltage, B+ equal to 24 volts and a total D.C. current equal to about 3 milliamps.

While regions of the device described by way of example herein are of a designated type of semiconductivity, it is to be understood that the semiconductivity of the various regions may be reversed from that shown and operation achieved in the same manner with a reversal of the polarity of bias potential.

While the device has been described as being made from a body of semiconductive silicon material, it is to be understood that other materials such as germanium or a semiconductive compound of two elements of Group IV of the Periodic Table such as silicon carbide, or a compound of an element of Group II of the Periodic Table and an element of Group VI of the Periodic Table such as cadmium sulfide, or a compound of an element of Group III of the Periodic Table and an element of Group V of the Periodic Table such as gallium arsenide are also suitable.

In addition to planar double diffused structures, various other fabrication techniques are suitable. For example a mesa type structure may be formed by diffusing a continuous P-type layer on the substrate and then by selective etching removing those portions other than as desired for the P-type portions 21 through 27. Also some alloying techniques may be incorporated such as for the formation of the emitters 31 and 32. Furthermore, use of epitaxial techniques such as those described for functional block fabrication in copending application, Serial No. 146,624, filed October 20, 1961, by B. T. Murphy and assigned to the same assignee as the present application, are suitable.

A further possible modification has to do with adjustment of the values of the resistances provided within the structure. While it is the case that resistances of suitable magnitude can be provided by calculating the resistivity of the material and the necessary volume, it is sometimes desirable to be able to adjust the resistance to be employed after the device is fabricated. This would for example permit use with D.C. bias sources of different power levels. This may be done by providing a plurality of contact points at which to tap a resistive region. For example, if the resistance 23 had applied thereto a conductive strip extending across the elongated portions of the region, it could be seen that by selecting certain positions for breaking the conductive path that different amounts of resistance will be imposed in the circuit. Also, the tap point at contact 44 can be shifted to adapt the block to varying supply voltages and adjust it for optional performance.

While the present invention has been shown and described in certain forms only it will be understood by those skilled in the art that it is susceptible to various changes and modifications without departing from the spirit and scope thereof.

What is claimed is:

1. Electronic apparatus for producing a local oscillator signal and mixing the local oscillator signal with an input carrier wave; said apparatus comprising first and second transistor means, each including base, emitter and collector regions; means to provide a direct resistive connection between the emitter of said first transistor means and the base of said second transistor; means to provide a resistive feedback loop between the collector and base of said first transistor means to permit operation of said first transistor means as an oscillator; means to provide first and second bias resistances connected to the collectors of said first and second transistor means, respectively, means to provide a resistive connection between the emitter and base of said second transistor means so that an input carrier wave applied to the base of said second transistor means is mixed in said second transistor means with an oscillatory signal produced by said first transistor means.

2. A semiconductor oscillator-mixer device comprising: a unitary body of semiconductive material including a substrate of a first semiconductivity type, a first group of regions of a second semiconductivity type disposed on a first major surface of said substrate and a second group of regions of said first semiconductivity type disposed on regions of said first group; a first transistor functional equivalent comprising a portion of said substrate to provide a collector, a region of said first group to provide a base and region of said second group to provide an emitter disposed on said base; a second transistor functional equivalent comprising another portion of said substrate to provide a collector, a second region of said first group to provide a base and a second region of said second group disposed on said second region of said first group to provide an emitter; said first transistor functional equivalent having associated therewith a feedback loop electrically between said base and said collector and including a portion of one of said regions of said first group, said first and second transistor functional equivalents each having bias resistances electrically connected to the collectors thereof and including portions of regions of said first group; connecting means associated with said first and second transistor functional equivalents to electrically connect the emitter of said first transistor functional equivalent to the base of said second transistor functional equivalent and to connect the base and emitter of said second transistor functional equivalent, each of said connecting means including a portion of a region of said first group; said first transistor functional equivalent being operative to produce a local oscillator signal applied to the base of said second transistor functional equivalent, said second transistor functional equivalent being capable of mixing a local oscillator signal from said first transistor functional equivalent with an input radio frequency signal to produce an intermediate frequency modulated signal.

3. Electronic apparatus capable of operating as an oscillator-mixer and comprising: a unitary body of semiconductive material including a substrate of a first semiconductivity type and a plurality of regions more highly doped than said substrate disposed thereon including a first group of regions of a second semiconductivity type and a second group of regions of said first semiconductivity type disposed on regions of said first group; said substrate and said first and second groups of regions forming a first and a second transistor functional equivalent each comprising a portion of said substrate to provide a collector, a region of said first group of regions to provide a base and a region of said second group of regions disposed on said region of said first group to provide an emitter; a feedback loop electrically between said collector and said base of said first transistor functional equivalent and including, in parallel, a portion of one of said regions of said first group to provide a stabilizing resistance and, external to said unitary body, a crystal to provide control of the oscillation of said first transistor functional equivalent; said first and second transistor functional equivalents having a bias network electrically from the collectors thereof to a source of D.C. potential external to said unitary body and including portions of regions of said first group and between the emitter of said first transistor functional equivalent and the base of said second transistor functional equivalent and between the base and emitter of said second transistor functional equivalent; means, external to said unitary body, to apply a modulated carrier signal to the base of said second transistor functional equivalent where said signal is mixed with a local oscillator signal produced by said first transistor functional equivalent to produce an intermediate frequency modulated signal appearing at said collector of said transistor functional equivalent.

References Cited in the file of this patent

UNITED STATES PATENTS

| | | |
|---|---|---|
| 2,851,594 | Herold | Sept. 9, 1958 |
| 2,853,602 | Farber | Sept. 23, 1958 |

OTHER REFERENCES

Kilby: "Semiconductor Solid Circuits," Electronics, Aug. 7, 1959, pages 110–111.

Langford: "Three Approaches to Microminaturization," Electronics, Dec. 11, 1959, pp. 49–51.

Electronics: "Function-Oriented Approaches," Nov. 25, 1960, pages 99–104.